(12) United States Patent
Ji

(10) Patent No.: US 7,567,367 B2
(45) Date of Patent: Jul. 28, 2009

(54) MICRO-MIRROR DEVICE AND ARRAY THEREOF

(75) Inventor: Changhyeon Ji, Seoul (KR)

(73) Assignee: LG Electronics Inc., Seoul (KR)

( * ) Notice: Subject to any disclaimer, the term of this patent is extended or adjusted under 35 U.S.C. 154(b) by 322 days.

(21) Appl. No.: 11/508,821

(22) Filed: Aug. 24, 2006

(65) Prior Publication Data

US 2007/0047046 A1 Mar. 1, 2007

(30) Foreign Application Priority Data

Aug. 26, 2005 (KR) ...................... 10-2005-0078755

(51) Int. Cl.
*G02B 26/08* (2006.01)

(52) U.S. Cl. ............... 359/224.1; 359/198.1; 359/199.1

(58) Field of Classification Search ......... 359/198–199, 359/224

See application file for complete search history.

(56) References Cited

U.S. PATENT DOCUMENTS

| 6,137,926 | A | 10/2000 | Maynard | |
|---|---|---|---|---|
| 6,275,324 | B1 | 8/2001 | Sneh | |
| 6,967,757 | B1* | 11/2005 | Allen et al. | .................. 359/224 |
| 2004/0070816 | A1 | 4/2004 | Kato et al. | |
| 2004/0130766 | A1 | 7/2004 | Dewa et al. | |
| 2005/0184351 | A1 | 8/2005 | Fu | |
| 2007/0159025 | A1* | 7/2007 | Mushika | ..................... 310/309 |

FOREIGN PATENT DOCUMENTS

| EP | 1 684 108 A1 | 7/2006 |
|---|---|---|
| WO | WO-01/92939 A1 | 12/2001 |

* cited by examiner

*Primary Examiner*—James Phan
(74) *Attorney, Agent, or Firm*—Birch, Stewart, Kolasch & Birch, LLP

(57) ABSTRACT

A micro mirror device and an array thereof are disclosed wherein an outer frame is formed at a position distanced from a mirror plate, thereby reducing a dynamic deformation of the mirror plate, preventing degradation of beam reflected from the mirror plate, and enabling to maintain a balance of the mirror plate. A frame structure supporting a diaphragm of a mirror plate is made to be thinner as it is distanced from a central axis of the mirror plate, thereby reducing a dynamic deformation of the mirror plate to a great extent and embodying the lightness of the device.

9 Claims, 13 Drawing Sheets

MICRO-MIRROR DEVICE AND ARRAY THEREOF

Pursuant to 35 U.S.C. .sctn. 119(a), this application claims the benefit of earlier filing date and right of priority to Korean Patent Application Nos. 2005-0078755, filed on Aug. 26, 2005, which is hereby incorporated by reference herein in their entirety.

BACKGROUND

This description relates to a micro-mirror device and an array thereof. With recent advances in optical devices, various techniques which use light as a medium for inputting and outputting lots of information and for information transmission have been on the rise. Among them, there is a method of scanning beams emergent from a light source such as a barcode scanner or a scanning laser display.

Depending on the applications thereof, beam scanning techniques are required to vary in scanning speed and range. In conventional beam scanning techniques, various scanning speeds and ranges are achieved mainly by controlling the incident angle of beam with regard to a reflection facet of an operational mirror, such as a galvanic mirror or a rotating polygon mirror.

Indeed, a galvanic mirror is appropriate for applications that demand scanning speeds of several tens of hertz (Hz), while the polygon mirror can implement scanning speeds of several kilohertz (kHz).

According to the development of related technologies, extensive efforts have been made to apply beam scanning techniques to new devices or to improve the performance of the pre-existing devices having the beam scanning techniques applied thereto. Representative examples thereof include projection display systems, HMDs (head mounted displays) and laser printers.

In systems where the beam scanning technique of such a high spatial resolution is employed, a scanning mirror is generally provided for allowing a high scanning speed and a large angular displacement or a tilting angle.

With reference to FIG. 1, a conventional scanning apparatus employing a polygon mirror is schematically shown. In the scanning apparatus, as shown in FIG. 1, a beam emergent from a light source 10 travels through an optical unit 11 including various lenses and is reflected by a polygon mirror 12. As the polygon mirror 12 is rotated by a driving motor 13 formed underneath the polygon mirror 12, the incident beam can be scanned in the direction defined by the rotating direction (A) of the polygon mirror 12.

Generally, the polygon mirror 12 is usually mounted on the rotating motor 13 rotating at a high speed, so that the scanning speed depends on or proportional to the angular velocity of the polygon mirror 12.

As the scanning speed depends on or proportional to the rotational angular speed of the polygon mirror 12, a limited rotation speed of the motor leads to the limitation in increasing the scanning speed of the polygon mirror 12, resulting in difficulty or inadequacy for high resolution displays.

In addition, it is difficult to decrease the overall size of a system and the consumption of power due to the driving motor, which has fundamental problems of friction noise and contributes to an increase in production cost because of its complex structures. As one of the attempts to solve these problems, a micro mirror has been presented.

With reference to FIG. 2, a conventional scanning apparatus employing a micro mirror is schematically shown. In the scanning apparatus, as shown in FIG. 2, a beam emergent from a light source 20 travels through an optical unit 21 including various lenses and is reflected by a micro mirror 22.

In other words, a micro mirror 22 is rotated on torsion beam 23 as axes formed at both sides of the micro mirror 22 so that the beam incident on the micro mirror 22 can be scanned in the direction defined by the rotating direction (B) of the micro mirror 22.

As for the micro mirror 22, it allows a scanning apparatus to scan bi-directionally and at a high speed of tens of KHz, so that it is adequate for high resolution displays. However, if the micro mirror is driven at a high scanning speed under a harsh condition, as shown in FIG. 3, the micro mirror 22 is generated with a dynamic deflection to distort a reflection facet to result in the reflected beam being degraded.

The micro mirror 22 may be manufactured in various shapes depending on any particular application, and generally it comes and is used in the shape of a square, a rectangle, a circle, an oval and a lozenge. The micro mirror 22 shows various dynamic deflections according to its shape.

FIG. 5 is a graph illustrating a simulation of a dynamic deflection of a round micro mirror of FIG. 4, where the round micro mirror of FIG. 4 rotates to both directions about an axis defined by the torsion beams 28 to produce a dynamic deflection as illustrated in FIG. 5.

SUMMARY

Accordingly, the present invention has been made keeping in mind the aforementioned problems and an object of the present invention is to provide a micro mirror device and an array thereof configured to form an outer frame at a position distanced from a mirror plate, thereby decreasing a dynamic deformation of the mirror plate and preventing degradation of beam reflected from the mirror plate.

In an aspect of the invention, a micro mirror device comprises: a mirror plate including a diaphragm formed with a reflection facet reflecting an incident beam and a support frame disposed underneath the diaphragm to support the diaphragm; an outer frame formed at a position distanced from a periphery of the mirror plate; a plurality of connectors connecting the mirror plate to the outer frame; and a pair of elastic flexible structures symmetrically formed based on the mirror plate, and connected to the outer frame and a pair of supports for floating the mirror plate and the outer frame from thereunder.

In another aspect of the invention, a micro mirror device comprises: a mirror plate including a diaphragm formed with a reflection facet reflecting an incident beam and a support frame disposed underneath the diaphragm to support the diaphragm; an outer frame formed at a position distanced from a periphery of the mirror plate; a plurality of connectors connecting the mirror plate to the outer frame; a gimbal formed at a position distanced from a periphery of the outer frame; a pair of inner elastic flexible structures connected to the gimbal and the outer frame and symmetrically formed based on the mirror plate; and a pair of outer elastic flexible structures symmetrically formed based on the mirror plate, and connected to the gimbal and a pair of supports for floating the mirror plate, the outer frame and the gimbal from thereunder.

In yet another aspect of the invention, a micro mirror device array comprises: a substrate; and a micro mirror device formed in arrays of rows and columns on a top surface of the substrate, wherein the micro mirror device comprises: a mirror plate including a diaphragm formed with a reflection facet reflecting an incident beam and a support frame disposed underneath the diaphragm to support the diaphragm; an outer frame formed at a position distanced from a periphery of the mirror plate; a plurality of connectors connecting the mirror plate to the outer frame; and elastic flexible structures symmetrically formed based on the mirror plate, and connected to the outer frame and a pair of supports for floating the mirror plate and the outer frame from thereunder.

DETAILED DESCRIPTION

Reference will now be made in detail to the preferred embodiments of the present invention, examples of which are illustrated in the accompanying drawings. Wherever possible, the same reference numbers will be used throughout the drawings to refer to the same or like parts. These embodiments, offered not to limit but only to exemplify and teach the invention, are shown and described in sufficient detail to enable those skilled in the art to practice the invention. Thus, where appropriate to avoid obscuring the invention, the description may omit certain information known to those of skill in the art.

Figure 6:
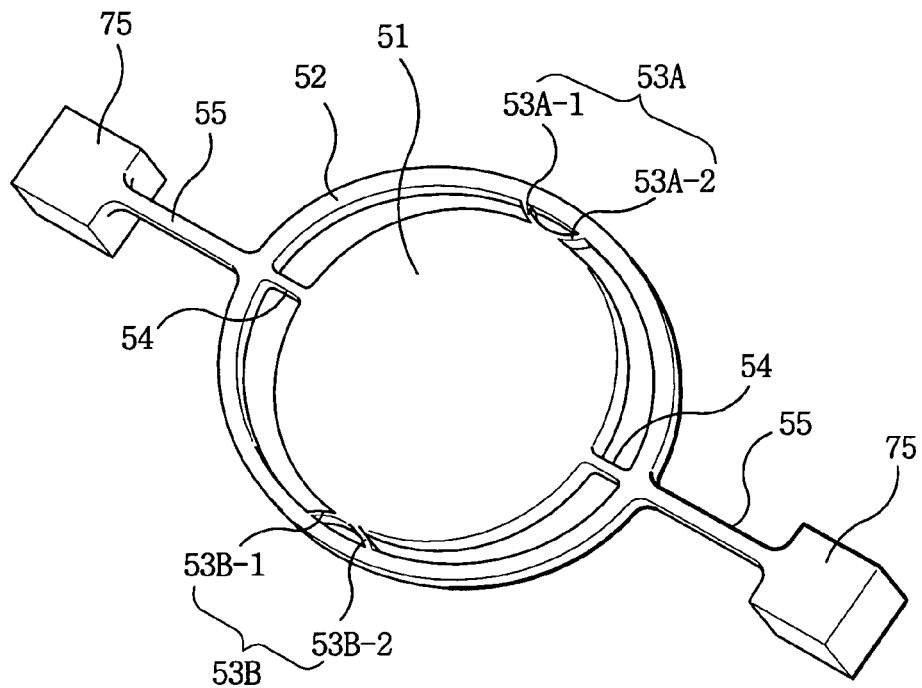
FIG. 6 is a perspective view illustrating an exemplary embodiment of a micro mirror device according to the present invention.

FIG. 6 is a perspective view illustrating an exemplary embodiment of a micro mirror device according to the present invention. Referring to FIG. 6, the micro mirror device comprises: a mirror plate (51) including a diaphragm formed with a reflection facet reflecting an incident beam and a support frame disposed underneath the diaphragm to support the diaphragm; an outer frame (52) formed at a position distanced from a periphery of the mirror plate (51); a plurality of connectors (53A, 53B, 54) connecting the mirror plate (51) to the outer frame (52); and a pair of elastic flexible structures (55) symmetrically formed relative to the mirror plate (51), and connected to the outer frame (52) and a pair of supports (75) for floating the mirror plate (51) and the outer frame (52) from thereunder.

At a periphery of the mirror plate (51) there is disposed the outer frame (52) concentrically formed with the mirror plate (51) for dispersing a dynamic deformation of the mirror plate (51), and the mirror plate (51) and the outer frame (52) are simultaneously rotated about elastic flexible structures (55) as an axis to reflect an incident beam to a predetermined direction.

Figure 7:
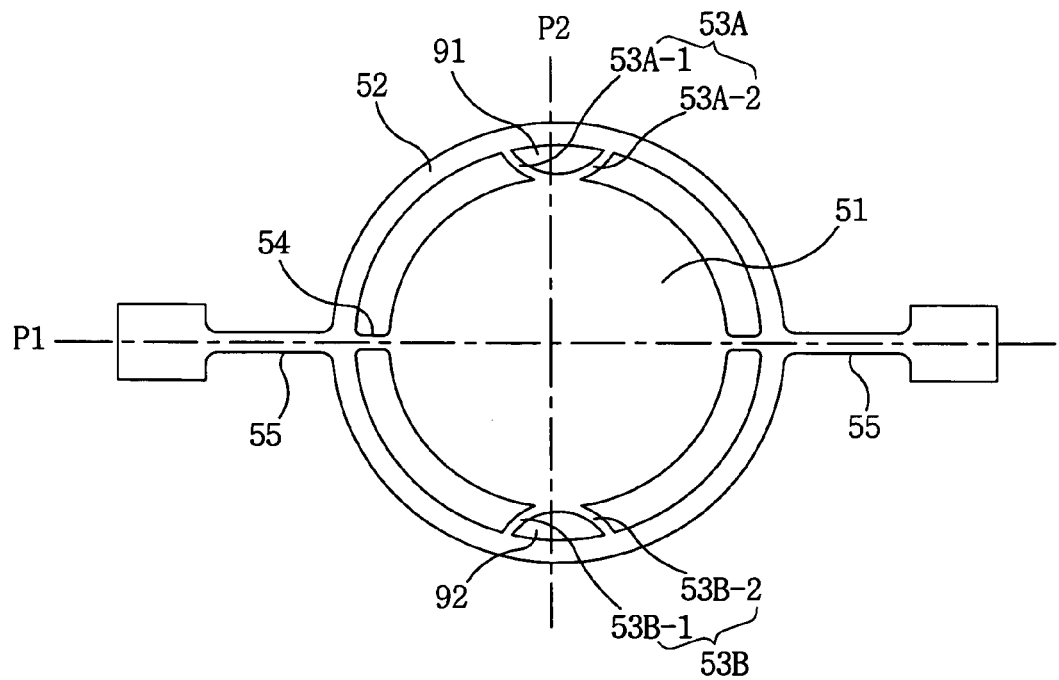
FIG. 7 is a schematic conceptual view illustrating a connector of a micro mirror device according to the present invention.

Referring to FIG. 7, the outer frame (52) is distanced from the mirror plate (51), and the plurality of connectors (53A, 53B,54) connecting the outer frame (52) to the mirror plate (51) are formed on a first line (P1) connecting a pair of elastic flexible structures (55), and include a first connector (54) symmetrically formed relative to the mirror plate (51), and a second connector formed on a second line (P2) perpendicular to the first line (P1), and symmetrically formed relative to the mirror plate (51).

Preferably, the second connector is formed on the second line (P2) perpendicular to the first line (P1), and includes connectors (53A-1, 53A-2, 53B-1, 53B-2) symmetrically formed relative to the mirror plate (51), in order to minimize the dynamic deflection of the micro mirror.

Because the second connector includes connectors (53A-1, 53A-2, 53B-1, 53B-2) symmetrically formed relative to the mirror plate (51) each formed on the second line (P2) perpendicular to the first line (P1), there are formed spaces (91, 92) between the mirror plate (51) and the outer frame (52) by the connectors (53A-1, 53A-2, 53B-1, 53B-2), thereby allowing the dynamic deflection of the mirror plate (51) to be absorbed by the outer frame (52).

Without the second connector, the mirror plate (51) and the outer frame (52) would be directly connected, and if the mirror plate and the outer frame are directly connected without the second connector, the outer frame (52) cannot absorb the dynamic deflection, and may only flutter like the mirror plate (51).

Meanwhile, the first connector (54) may not be formed on the first line (P1) connecting the pair of elastic flexible structures (55), but the second connector must be formed on the second line (P2) perpendicular to the first line (P1).

The elastic flexible structures (55) serve to connect the outer frame (52) to a pair of supports (75) to float the mirror plate (51) and the outer frame (52) from thereunder, and function as rotational axes when the micro mirror device is driven to provide a restoring torque. At this time, the supports (75) are partially and schematically shown. As noted above, in case the outer frame (52) is formed at the periphery of the mirror plate (51) and rotates about an axis defined by the elastic flexible structures (55), the dynamic deflection of the mirror plate (51) can be absorbed by the outer frame (52) to enable to keep balance of the mirror plate (51).

Figure 1:
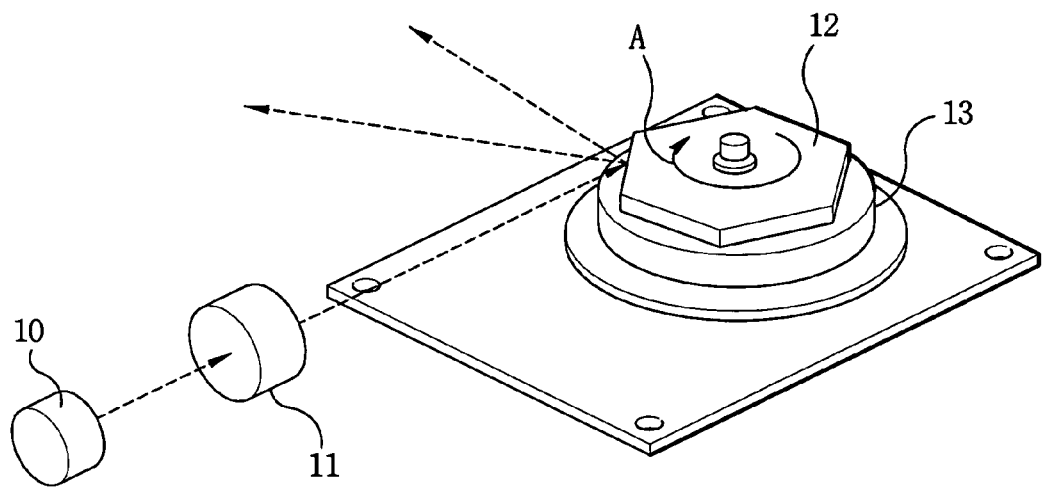
FIG. 1 is a schematic perspective view of a beam scanning apparatus employing a conventional polygon mirror.
Figure 2:
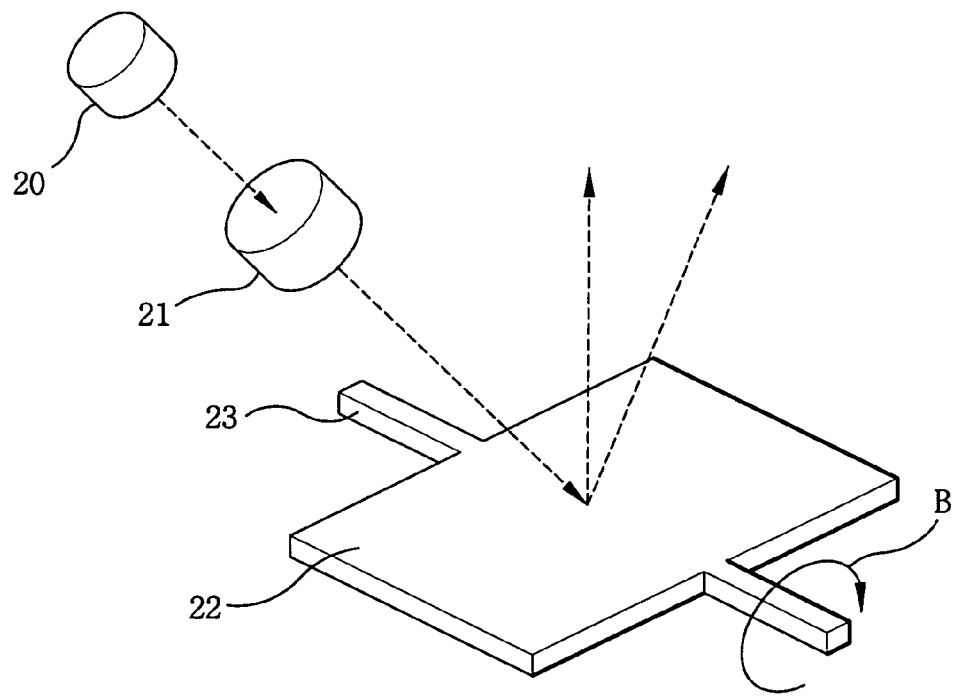
FIG. 2 is a schematic perspective view of a conventional beam scanning apparatus employing a micro mirror device.
Figure 3:
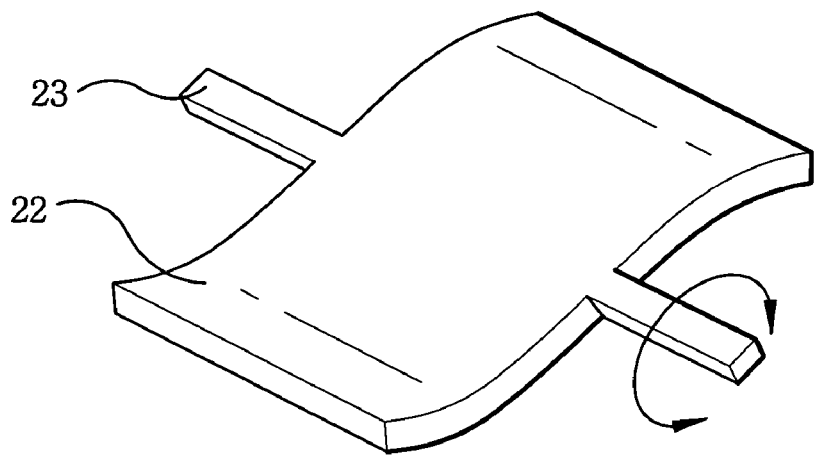
FIG. 3 is a schematic view illustrating a dynamic deflection of a micro mirror device.
Figure 4:
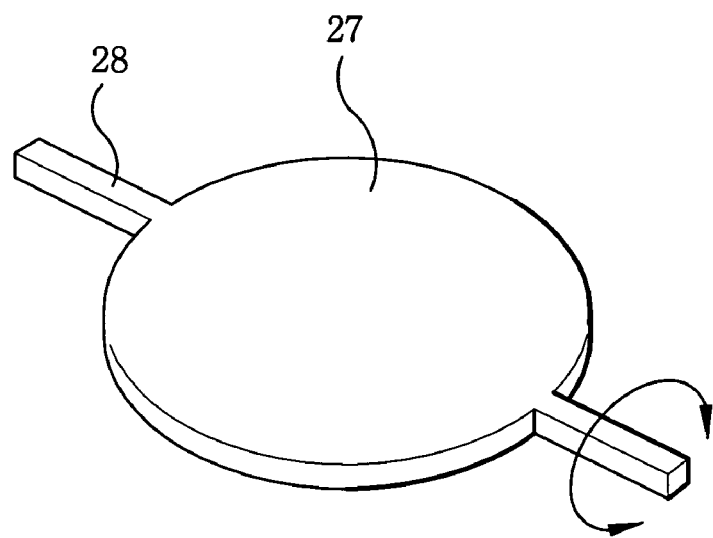
FIG. 4 is a schematic perspective view illustrating a round micro mirror according to prior art.
Figure 5:
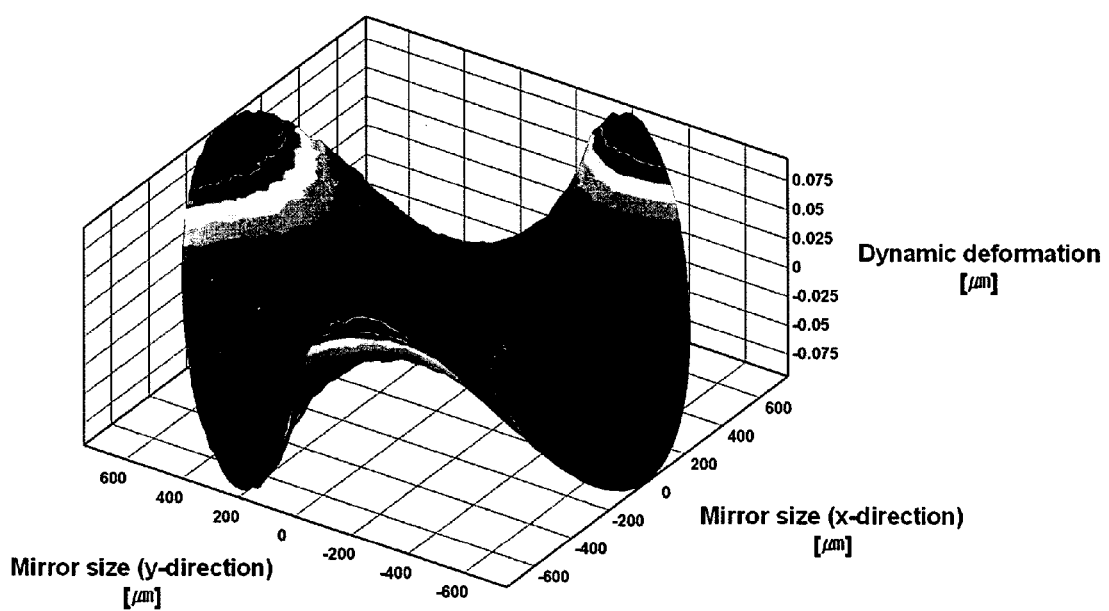
FIG. 5 is a graph illustrating a simulation of a dynamic deflection of a round micro mirror device of FIG. 4.
Figure 8:
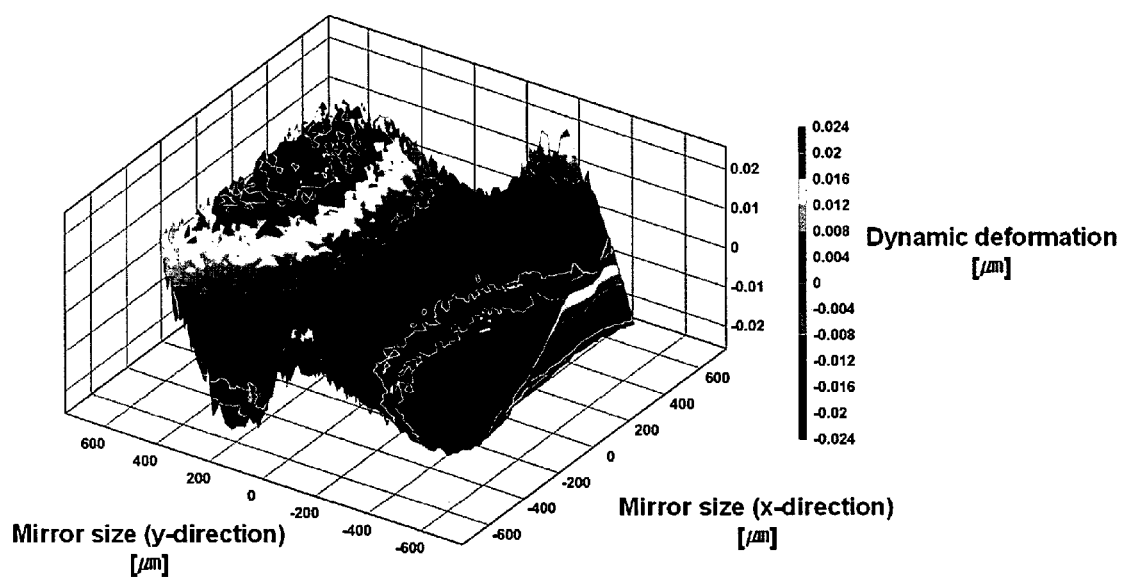
FIG. 8 is a graph illustrating a simulation of a dynamic deformation of a micro mirror device according to the present invention.

FIG. 8 is a graph illustrating a simulation of a dynamic deformation of a micro mirror device according to the present invention, where it can be noted that the dynamic deformation of the micro mirror has markedly decreased over that of the case shown in FIG. 5 according to the prior art.

Figure 9:
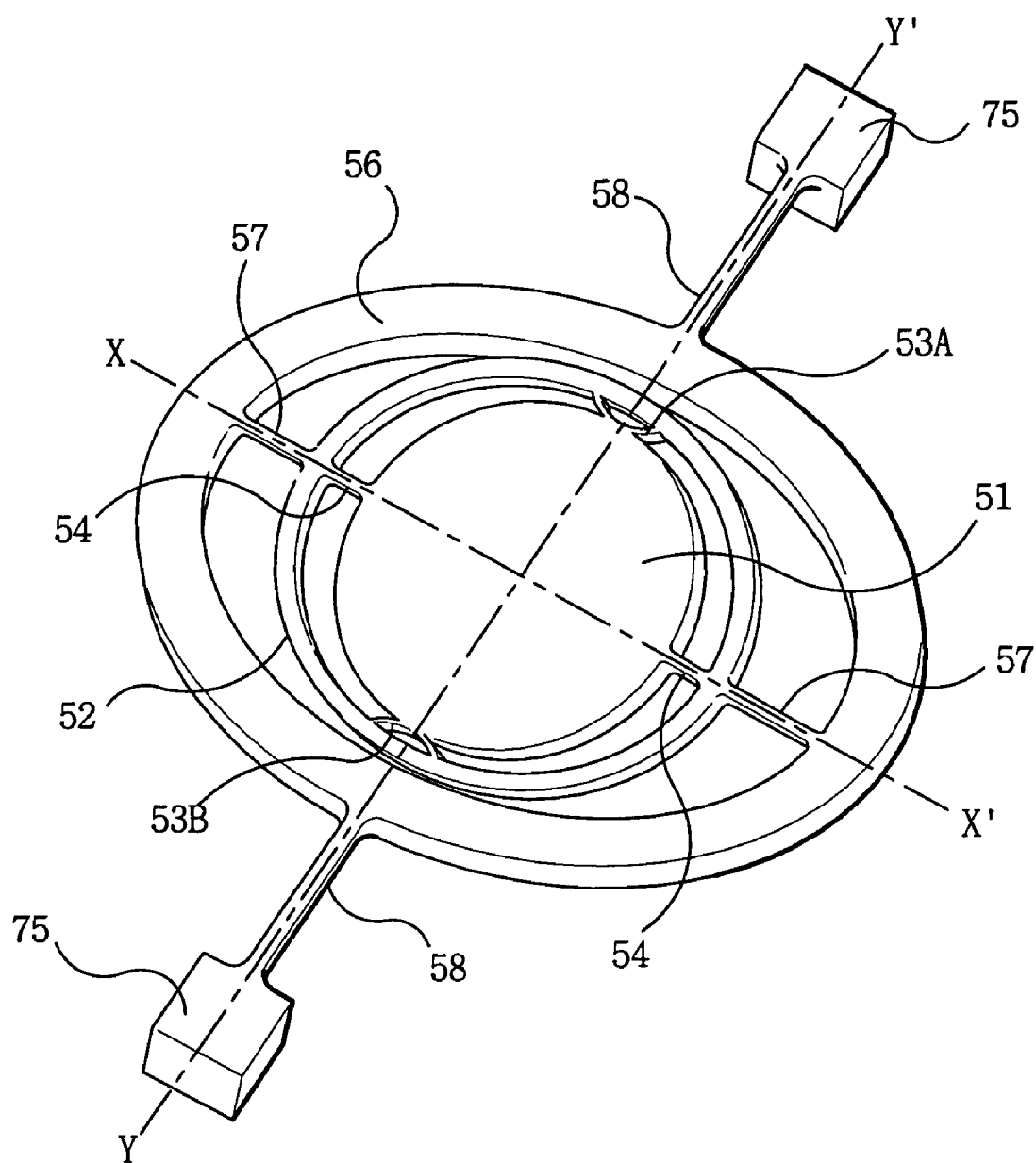
FIG. 9 is a perspective view illustrating another exemplary embodiment of a micro mirror device according to the present invention.

FIG. 9 is a perspective view illustrating another exemplary embodiment of a micro mirror device according to the present invention. The micro mirror device comprises: a mirror plate (51) including a diaphragm formed with a reflection facet reflecting an incident beam and a support frame disposed underneath the diaphragm to support the diaphragm; an outer frame (52) formed at a position distanced from a periphery of the mirror plate (51); a plurality of connectors (53A,53B,54) connecting the mirror plate (51) to the outer frame (52); a gimbal (56) formed at a position distanced from a periphery of the outer frame (52); a pair of inner elastic flexible structures (57) connected to the gimbal (56) and the outer frame (52) and symmetrically formed relative to the mirror plate (51); and a pair of outer elastic flexible structures (58) symmetrically formed relative to the mirror plate (51), and connected to the gimbal (56) and a pair of supports (75) for floating the mirror plate (51), the outer frame (52) and the gimbal (56) from thereunder.

At a periphery of the mirror plate (51) there is disposed the outer frame (52) concentrically formed with the mirror plate (51) distanced from the mirror plate (51), and at the periphery of the outer frame (52) there is formed the gimbal (56) concentrically formed with the mirror plate (51) and distanced from the outer frame (52).

Figure 10:
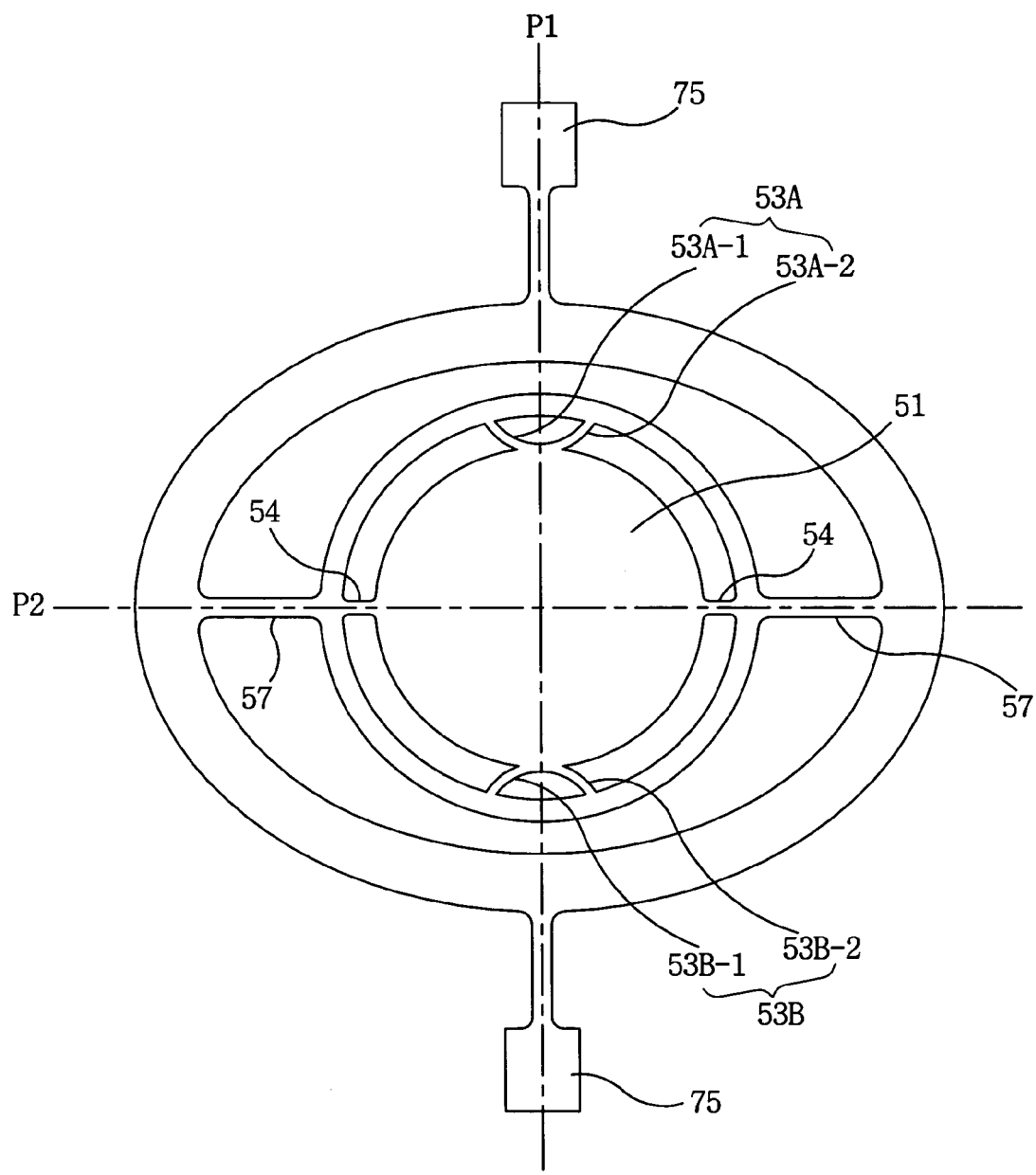
FIG. 10 is a schematic conceptual view illustrating a connector of the micro mirror device of FIG. 9 according to the present invention.

Referring to FIG. 10, the plurality of connectors (53A,53B, 54) connecting the outer frame (52) to the mirror plate (51) are formed on the first line (P1) connecting the pair of elastic flexible structures (55), and include a first connector (54) symmetrically formed relative to the mirror plate (51) and formed on the second line (P2) perpendicular to the first line (P1), and a second connector formed on the first line (P1) connecting the pair of elastic flexible structures (55) and symmetrically formed relative to the mirror plate (51).

The gimbal (56) is connected to the outer frame (52) by the inner elastic flexible structure (57), and connected to the support (75) by the outer elastic flexible structure (58) symmetrically formed on a line perpendicular to the inner elastic flexible structure (57).

The outer elastic flexible structure (58) floats the mirror plate (51), the outer frame (52) and the gimbal (56) from thereunder by connecting the gimbal (56) to the support (75). At this time the support (75) is schematically and partially shown.

The inner and outer elastic flexible structures (57, 58) provide restoring torque when the micro mirror device is driven and function as rotational axes.

In other words, the outer frame (52) is rotated about an axis defined by the inner elastic flexible structure (57) (an axis connecting X to X' as depicted in FIG. 9, and hereinafter referred to as X axis), and the gimbal (56) is rotated about an axis defined by the outer elastic flexible structure (58) (an axis connecting Y to Y' as shown in FIG. 9, and hereinafter referred to as Y axis).

The micro mirror device thus structured can provide freedom of rotational movement about two axes. In other words, a rotational movement about an X axis defined by the inner elastic flexible structure (57) and a rotational movement about a Y axis defined by the outer elastic flexible structure (58) are possible, and the movement to each axial direction is not affected by the gimbal (56) structure to enable an independent control, such that a micro mirror device having an arbitrary angle within a two dimensional plane can be embodied.

In FIGS. 6 and 9, the mirror plate may be manufactured in one of various shapes such as a round shape, or either an oval shape or rectangular shape. The outer frame (52) and the gimbal (56) may be manufactured in various shapes according to the shape of the mirror plate (51). At this time, the mirror plate (51) may be formed in a lozenge or a diamond shape.

However, the mirror plate (51) is preferred to be manufactured in a round or an oval shape in order to minimize the dynamic deformation of the mirror plate (51), and the outer frame (52) and the gimbal (56) are preferably manufactured in a ring shape.

Furthermore, the first and second connectors that connect the outer frame (52) to the mirror plate (51) may be manufactured with different positions, shapes and numbers thereof, and if the positions and shapes of the first and second connectors are varied, shapes of the dynamic deformation of the micro mirror device are also varied. However, if the outer frame (52) is connected by the mirror plate (51) and a single connector, the dynamic deformation cannot be absorbed by the outer frame (52), and if the first and second connectors are too broad, the dynamic deformation increases markedly, which should be taken into account in manufacturing thereof.

The elastic flexible structure connecting the micro mirror to the support (75) may be formed in various shapes such as a torsion beam type, a V-shaped beam type and a meander type shape according to a driving direction and a driving method of the micro mirror device, and a combination thereof may be also possible.

Figure 11:
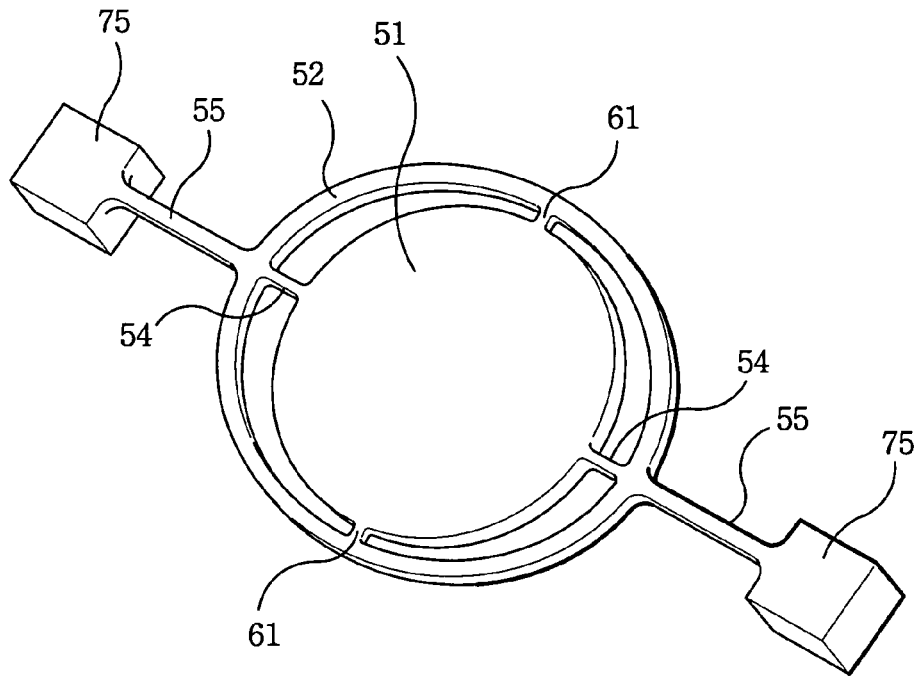
FIG. 11 is a perspective view illustrating a shape of a connector of a micro mirror device according to an embodiment of the present invention.

FIG. 11 is a perspective view illustrating an exemplary embodiment of a connector having a different shape from that of FIG. 6, where the second connector perpendicular to the first connector (54) includes plural (two) connectors at two areas, while a single connector (61) is formed at each (two) area in FIG. 11.

As depicted in FIG. 11, if the second connector is singularly formed, it is easy to manufacture, and this kind of structure may be applied to a micro mirror device having two rotational axes.

A mirror plate of the micro mirror device includes a diaphragm having a reflection facet for reflecting the incident beam, and a support frame for supporting the diaphragm and for preventing the mirror plate from being dynamically deformed during scanning. The reflection facet is preferably made of one of a metal film, a dielectric film, and a film layered by the two elements.

Furthermore, the support frame may have the same shape as that of the diaphragm, but other shapes may include, for example, a single structure of a diamond or a starfish shape, or a structure arrayed in a certain shape.

Figure 12:
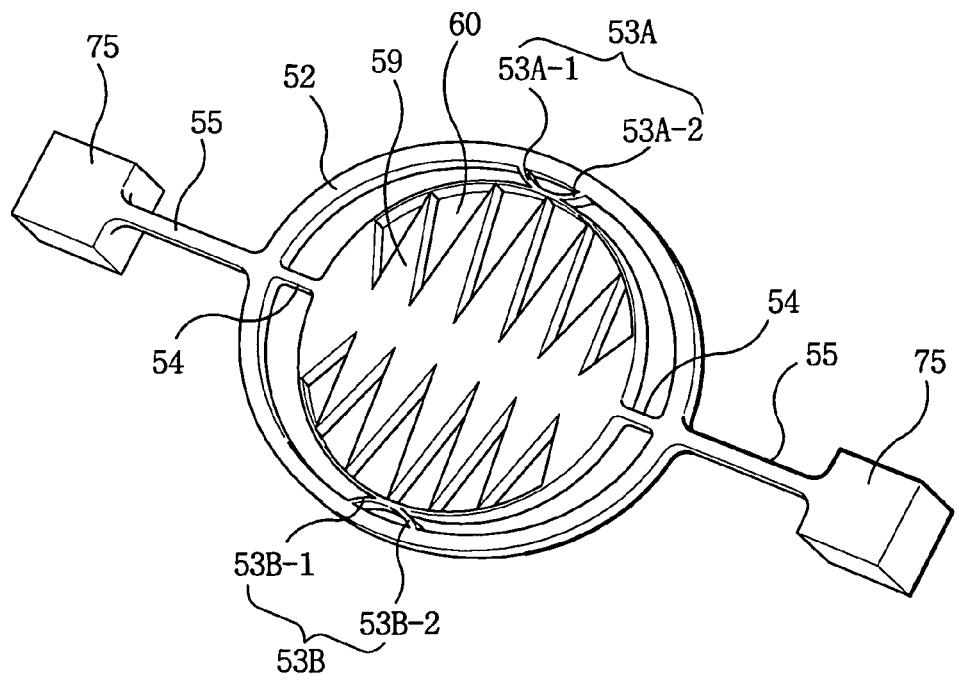
FIG. 12 is a perspective view illustrating a shape of a frame of a mirror plate according to an embodiment of the present invention.

FIG. 12 is a perspective view illustrating an exemplary shape of a frame of a mirror plate according to the present invention, where a support frame (59) has a shape of a sawtoothed array, parts of which are symmetrically V-cut.

If the mirror plate is formed with the support frame (59) in a saw-toothed array on a round diaphragm (60), instead of a round support frame on a round diaphragm (60), mass and inertia of the support frame can be partially reduced to thereby enable to limit the dynamic deformation of the micro mirror device.

In other words, a total deformation by the dynamic deformation of the micro mirror device is determined by a length from a rotational axis to a distal end of a mirror plate (i.e., shape of the mirror plate) and a thickness of the mirror plate, where, as a thickness of the support frame has a larger value than that of the diaphragm, the size of the dynamic deformation is determined by the support frame when the micro mirror device is driven.

Therefore, if the support frame (59) is partially removed to get a saw-toothed shape of array, the mass and inertial of the support frame can be partially decreased to thereby enable to limit the dynamic deformation of the micro mirror device.

Furthermore, if a support frame is formed with a saw-toothed shape of array as shown in FIG. 12 instead of a single structure of a predetermined shape, there is an advantage in that an overall strength of a diaphragm of a mirror plate can be enhanced along with the reduced effect of the dynamic deformation.

The dynamic deformation decreases if mass gradually decreases from the center of the mirror plate to a periphery thereof when the micro mirror device is driven. Similarly, the dynamic deformation can be reduced by adopting any type of support frame taking the lion's share of the mass of the mirror plate, the support frame so made as to be reduced in the mass from the center of the mirror plate to the periphery thereof.

Figure 13:
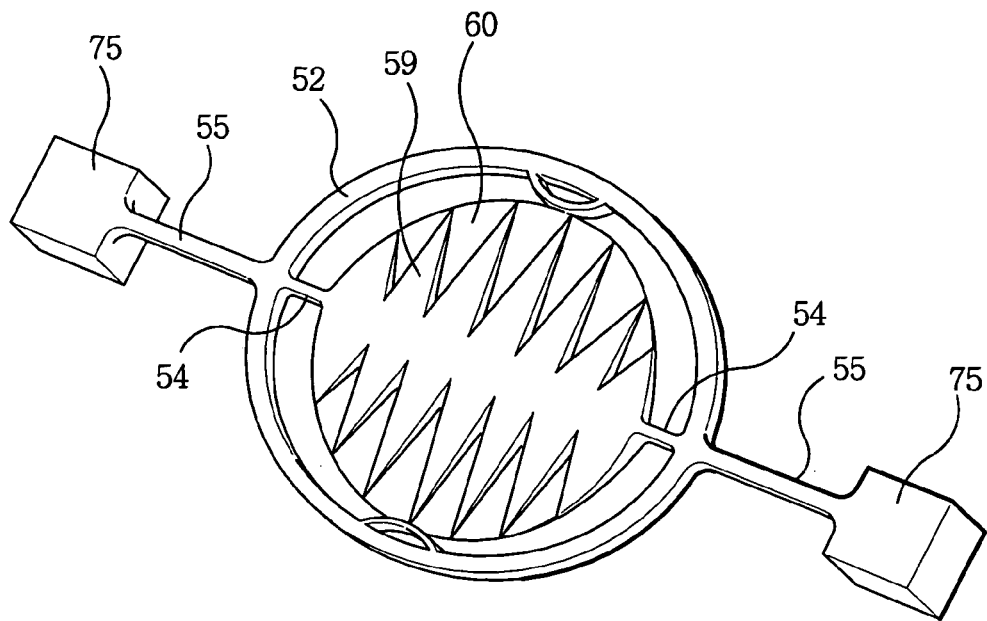
FIG. 13 is a perspective view illustrating a shape of a frame of a mirror plate according to another embodiment of the present invention.

For example, as shown in FIG. 13, if a support frame (59) is used that has a saw-tooth shaped array and that has a thickness gradually tapering off from the center of the mirror plate to the periphery thereof, mass and inertia of the support frame can be significantly reduced to limit the dynamic deformation to a great extent.

Figure 14:
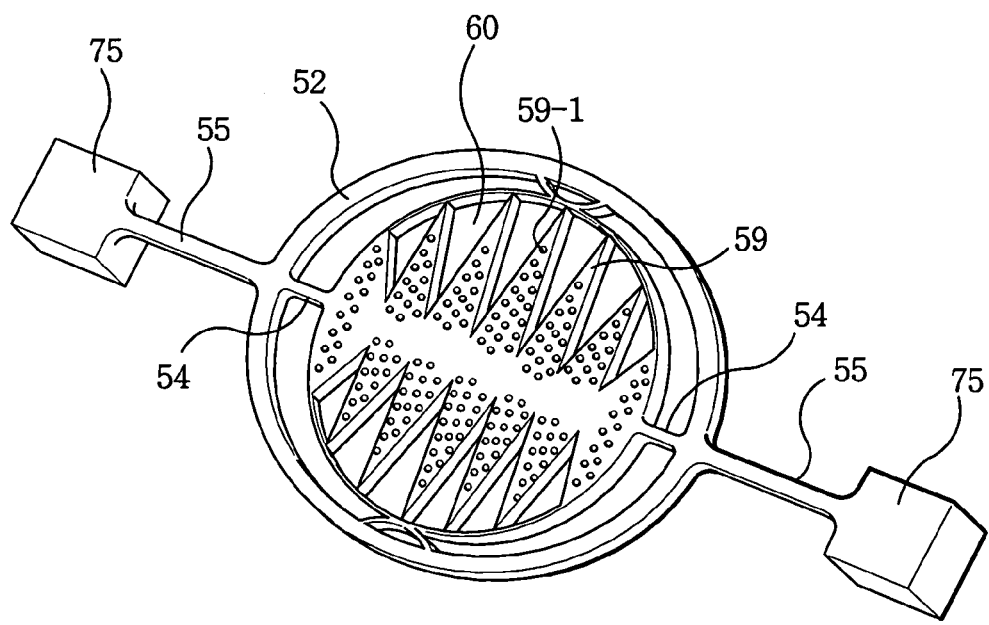
FIG. 14 is a perspective view illustrating a shape of a frame of a mirror plate according to still another embodiment of the present invention.

With reference to FIG. 14, if a plurality of grooves (59-1) is formed on the saw-toothed array of the support frame (59), there is an advantage in that mass and inertia are further reduced. The shapes of grooves (59-1) may vary but in the present invention, each shape of the grooves is hexagonal like a honeycomb. As noted above, if a support frame structure with a variety of shapes is formed with grooves, or thickness is differently adjusted according to the position of the support frame, the dynamic deformation of the micro mirror device can be reduced.

Meanwhile, the micro mirror device additionally needs a driving unit for applying a driving torque or a driving force as a means for realizing the scanning function, and an electrostatic method, an electromagnetic method, a thermal method or a piezoelectric method may be employed for driving the micro mirror device.

Figure 15:
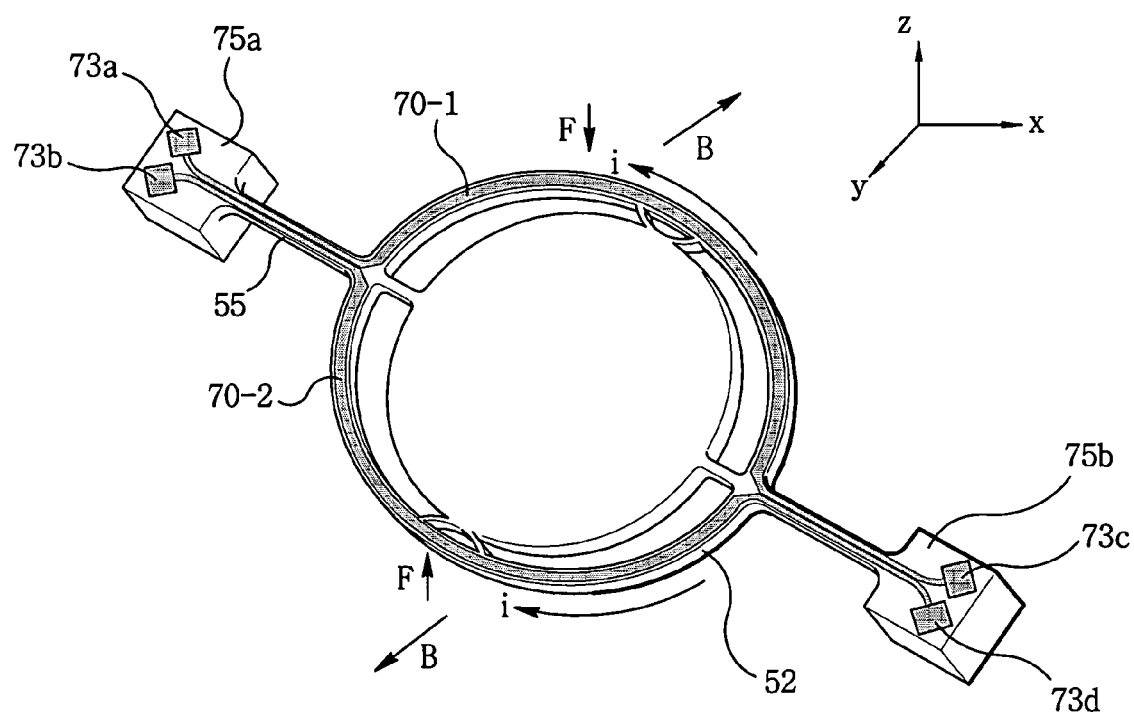
FIG. 15 is a schematic view illustrating a micro mirror device of electromagnetic force driving type according to the present invention.

FIG. 15 is a schematic view illustrating a micro mirror device of electromagnetic force driving type according to the present invention. The micro mirror device comprises: a pair of first electrodes (73a, 73b) formed on one support (75a) out of a pair of supports (75a, 75b); a pair of second electrodes (73c, 73d) formed at the other support (75b) out of the pair of supports (75a, 75b); and a pair of conductors (70-1, 70-2) connected from the first electrodes (73a, 73b) to the second electrodes (73c, 73d).

As noted above, the first conductor (70-1) is formed on an upper hemisphere of the elastic flexible structure (55) and the outer frame (52), and the second conductor (70-2) is formed on a lower hemisphere of the elastic flexible structure (55) and the outer frame (52). The first and second conductors (70-1, 70-2) are electrically connected to the electrodes (73a, 73b, 73c, 73d) formed on the supports (75a, 75b).

If current flows on the first and second conductors (70-1, 70-2), the upper hemisphere of the outer frame (52) receives force in the direction of −z while the lower hemisphere of the outer frame (52) receives force in the direction of +z according to Fleming's left hand rule as shown in FIG. 15, such that the mirror plate (51) rotates about an axis defined by the elastic flexible structure (55).

The first and second conductors (70-1, 70-2) may be formed in one single conductor. In other words, the single conductor may be formed in such a fashion as to be disposed on one side of an elastic flexible structure (55) of the symmetrically formed elastic flexible structures (55), branched out on the outer frame (52) and joined again on the other side of the elastic flexible structure (55).

Figure 16:
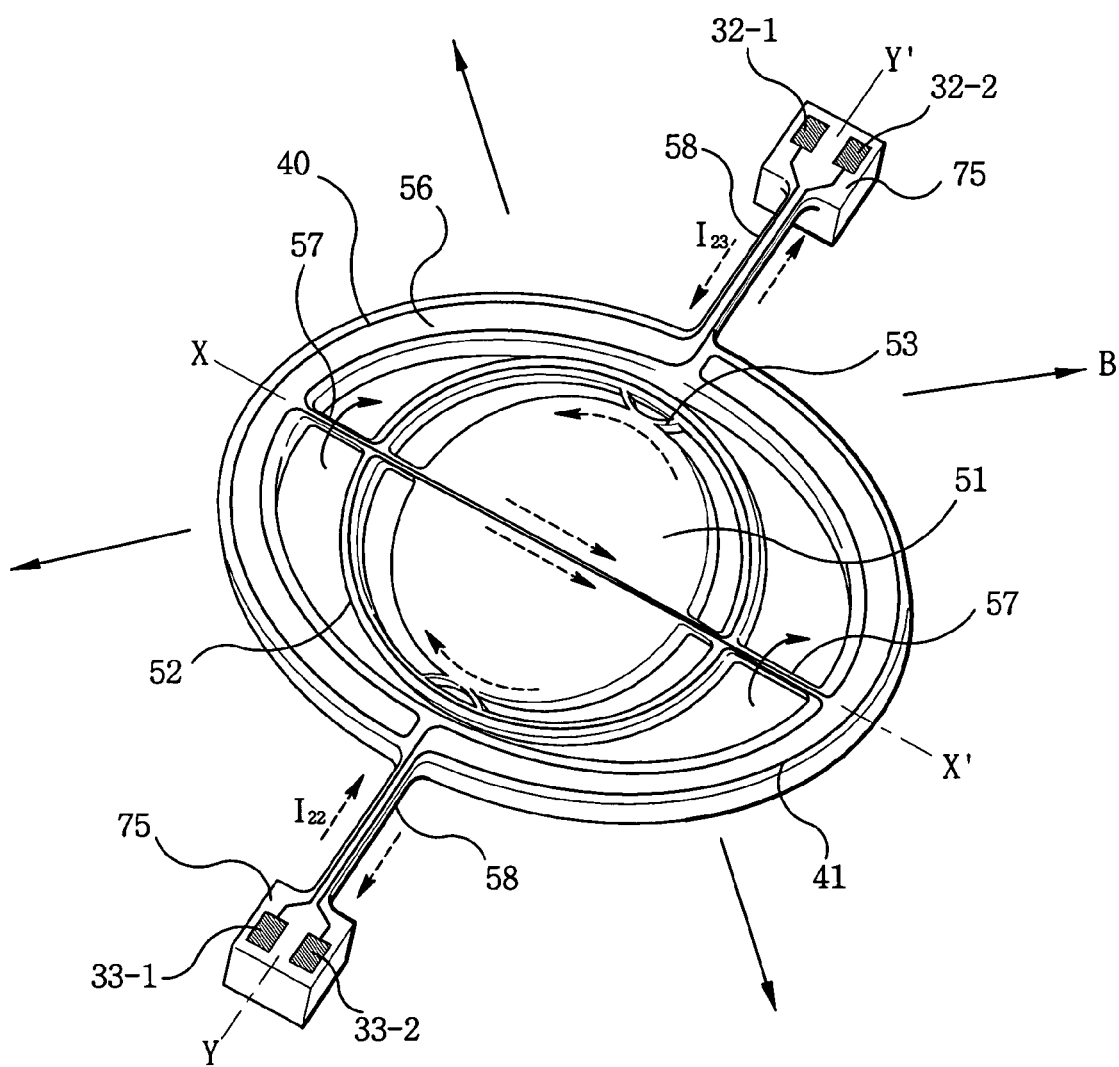
FIG. 16 is a schematic view illustrating a micro mirror device being driven to the direction of X axis by the electromagnetic force according to the present invention.

FIG. 16 is a schematic view illustrating a micro mirror device being driven to the direction of X axis by the electromagnetic force according to the present invention, wherein first X axis driving electrodes (32-1, 32-2) are formed on a predetermined area of the support (75), and a first conductor (40) electrically connected to the first X axis driving electrodes (32-1, 32-2) is continuously formed on an elastic flexible structure (58), a gimbal (56), an inner elastic flexible structure (57), a mirror plate (51) and the outer frame (52).

Furthermore, second X axis driving electrodes (33-1, 33-2) are formed on the other area of the support (75) and a second conductor (41) electrically connected to the second X axis driving electrodes (33-1, 33-2) is formed on the elastic flexible structure (58), the gimbal (56), the inner elastic flexible structure (57), the mirror plate (51) and the outer frame (52) in the symmetrical formation with the first conductor (40).

If voltage is applied to the first X axis driving electrodes (32-1, 32-2) and the second X axis driving electrodes (33-1, 33-2) to allow currents ($I_{22}$, $I_{23}$) to flow in the first and second conductors (40, 41), the mirror plate (51) rotates about the X axis to a predetermined degree.

Figure 17:
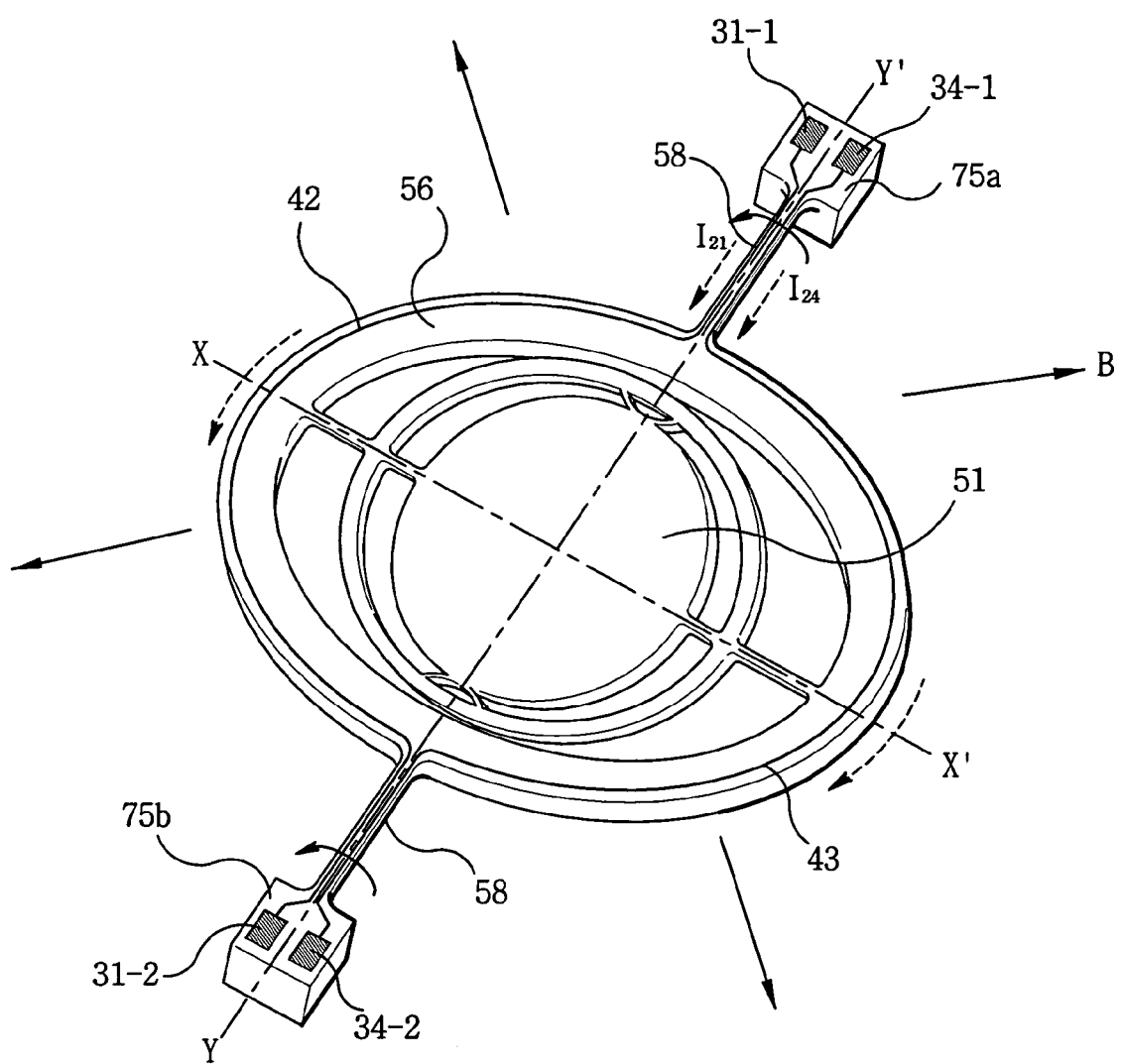
FIG. 17 is a schematic view illustrating a micro mirror device being driven to the direction of Y axis by the electromagnetic force according to the present invention.

FIG. 17 is a schematic view illustrating a micro mirror device being driven to the direction of Y axis by the electromagnetic force according to the present invention, wherein a first conductor (42) electrically connected to first Y axis driving electrodes (31-1, 31-2) formed on the pair of supports (75a,75b) is formed on an outer elastic flexible structure (58) and the gimbal (56). A second conductor (43) electrically connected to second Y axis driving electrodes (34-1, 34-2) is formed on the outer elastic flexible structure (58) and the gimbal (56). Therefore, the first and second conductors (42, 43) are symmetrically formed.

If voltage is applied to the first Y axis driving electrodes (31-1, 31-2) and the second Y axis driving electrodes (34-1, 34-2) to allow currents to flow in the first and second conductors (42, 43), the gimbal (56) rotates about the Y axis to a predetermined degree.

As described in FIGS. 16 and 17, the micro mirror device can rotates on the X axis defined by the inner elastic flexible structure (57) and also on the Y axis defined by the outer elastic flexible structure (58), and movement to each axial direction is not affected by the gimbal (56) structure enabling an independent control, such that a micro mirror device having a random angle within a 2-D plane can be embodied.

Figure 18:
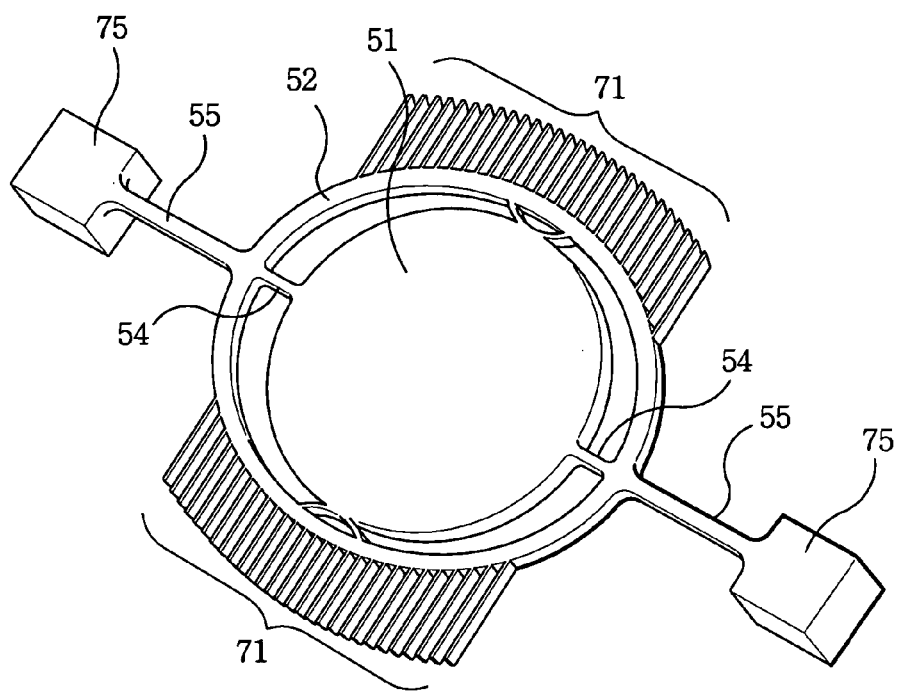
FIG. 18 is a schematic view illustrating a micro mirror device driven by an electrostatic force according to the present invention.

FIG. 18 is a schematic view illustrating a micro mirror device driven by an electrostatic force according to the present invention.

Referring to FIG. 18 in association with FIG. 7, a first comb electrode (71) is symmetrically formed relative to a part of the outer frame (52) based on the first line (P1) connecting the pair of elastic flexible structures (55). In other words, the first comb electrode (71) is formed symmetrically relative to the part of the outer frame (52) formed perpendicular to the elastic flexible structures (55) for electrostatic driving. At this time, a second comb electrode (not shown) is formed at a lower part engaged with the first comb electrode (71), being distanced from the lower part of the first comb electrode (71).

If voltage is applied to the first comb electrode (71) and the second comb electrodes, an electrostatic force is generated between the first and second comb electrodes, and mutually pulling force is generated to thereby drive the micro mirror device.

Figure 19:
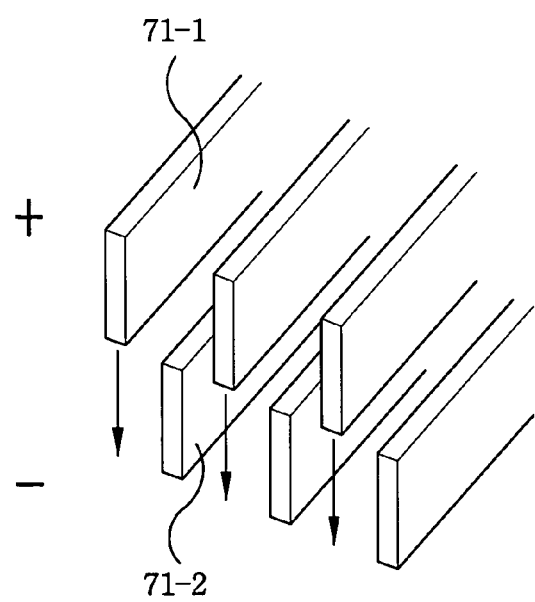
FIG. 19 is a schematic view illustrating an electrostatic force generated between comb-type electrodes of the micro mirror device of FIG. 18.

Referring now to FIG. 19, a first comb electrode (71-1) and a second comb electrode (71-2) are each spaced a predetermined distance apart, and the second comb electrode (71-2) is formed at an area engaged with the first comb electrode (71-1).

If voltage (+) is applied to the first comb electrode (71-1) and voltage (−) is applied to the second comb electrode (71-2), a mutually pulling force is generated between the first and second comb electrodes (71-1, 71-2) to drive the micro mirror device.

As noted above, the micro mirror device according to the present invention may be driven by formation of a piezoelectric material diaphragm at one side of the micro mirror, or by thermal deformation of structures, in addition to the driving methods employing the electromagnetic force or electrostatic force.

Furthermore, the micro mirror device according to the present invention may be embodied by M×N micro mirror array where the array is formed by M rows and N columns of matrix structure.

In other words, the micro mirror device array comprises: a substrate; and a micro mirror device formed in arrays of rows and columns on a top surface of the substrate, wherein the micro mirror device comprises: a mirror plate including a diaphragm formed with a reflection facet reflecting an incident beam and a support frame disposed underneath the diaphragm to support the diaphragm; an outer frame formed at a position distanced from a periphery of the mirror plate; a plurality of connectors connecting the mirror plate to the outer frame; and a pair of elastic flexible structures symmetrically formed relative to the mirror plate, and connected to the outer frame and a pair of supports for floating the mirror plate and the outer frame from thereunder.

Furthermore, the micro mirror device array comprises: a substrate; and a micro mirror device formed in arrays of rows and columns on a top surface of the substrate, wherein the micro mirror device comprises: a mirror plate including a diaphragm formed with a reflection facet reflecting an incident beam and a support frame disposed underneath the diaphragm to support the diaphragm; an outer frame formed at a position distanced from a periphery of the mirror plate; a plurality of connectors connecting the mirror plate to the outer frame; a gimbal formed at a position distanced from a periphery of the outer frame; a pair of inner elastic flexible structures connected to the gimbal and the outer frame and symmetrically formed relative to the mirror plate; and a pair of outer elastic flexible structures symmetrically formed relative to the mirror plate, and connected to the gimbal and a pair of supports for floating the mirror plate, the outer frame and the gimbal from thereunder.

Consequently, the micro mirror device according to the present invention can be embodied by M×N micro mirror array on a substrate where the array is formed by M numbers of rows and N numbers of columns of matrix structure.

As apparent from the foregoing, there is an advantage in the micro mirror device and an array thereof thus described according to the present invention in that an outer frame can be formed at a position distanced from a mirror plate, thereby decreasing a dynamic deformation of the mirror plate, thereby preventing degradation of beam reflected from the mirror plate, and enabling to maintain a balance of the mirror plate.

Furthermore, there is another advantage in that a frame structure supporting a diaphragm of a mirror plate is made to be thinner as it is distanced from a central axis of the mirror plate, thereby reducing a dynamic deformation of the mirror plate to a great extent and embodying the lightness of the device.

It will be appreciated by those of skill in the art that a new and useful micro mirror device and an array thereof has been described herein. In view of the many possible embodiments to which the principles of this invention may be applied, however, it should be recognized that the embodiments described herein with respect to the drawing figures are meant to be illustrative only and should not be taken as limiting the scope of invention. For example, those of skill in the art will recognize that the illustrated embodiments can be modified in arrangement and detail without departing from the spirit of the invention. Therefore, the invention as described herein contemplates such embodiments as may come within the scope of the following claims and equivalents thereof.

What is claimed is:

1. A micro mirror device comprising:
a mirror plate including a diaphragm formed with a reflection facet reflecting an incident beam and a support frame disposed underneath the diaphragm to support the diaphragm;
an outer frame formed at a position distanced from a periphery of the mirror plate;
a plurality of connectors connecting the mirror plate to the outer frame; and
a pair of elastic flexible structures symmetrically formed relative to the mirror plate, and connected to the outer frame and a pair of supports for floating the mirror plate and the outer frame from thereunder,
wherein the support frame is tapered off in thickness thereof as it is distanced from a center.

2. The device as defined in claim 1, wherein the mirror plate is one of a circle shape, an oval shape and a rectangular shape.

3. The device as defined in claim 1, wherein the outer frame is of a ring shape.

4. The device as defined in claim 1, wherein each of the pair of elastic flexible structures is one of a torsion beam type, a V-shaped beam type and a meander type shape, or a combination thereof.

5. The device as defined in claim 1, wherein the reflection facet is made of a metal film, a dielectric film, or a film layered by the two elements.

6. The device as defined in claim 1, further comprising:
a pair of first electrodes formed on one support out of a pair of supports;
a pair of second electrodes formed at the other support out of the pair of supports; and
a pair of conductors formed on the pair of elastic flexible structures and the outer frame so as to be connected from the first electrodes to the second electrodes.

7. The device as defined in claim 1, further comprising:
a first comb electrode symmetrically formed on a part of the outer frame based on the first line connecting the pair of elastic flexible structures; and
a second comb electrode formed at a lower part engaged with the first comb electrode and formed being distanced from the lower part of the first comb electrode.

8. A micro mirror device comprising:
a mirror plate including a diaphragm formed with a reflection facet reflecting an incident beam and a support frame disposed underneath the diaphragm to support the diaphragm;

an outer frame formed at a position distanced from a periphery of the mirror plate;

a plurality of connectors connecting the mirror plate to the outer frame; and a pair of elastic flexible structures symmetrically formed relative to the mirror plate, and connected to the outer frame and a pair of supports for floating the mirror plate and the outer frame from thereunder, wherein the plurality of connectors connecting the outer frame to the mirror plate comprises:

a first connector formed on a first line connecting the pair of elastic flexible structures, and symmetrically formed based on the mirror plate; and a second connector formed on a second line perpendicular to the first line, and symmetrically formed based to the mirror plate.

9. A micro mirror device comprising:

a mirror plate including a diaphragm formed with a reflection facet reflecting an incident beam and a support frame disposed underneath the diaphragm to support the diaphragm;

an outer frame formed at a position distanced from a periphery of the mirror plate;

a plurality of connectors connecting the mirror plate to the outer frame; and a pair of elastic flexible structures symmetrically formed relative to the mirror plate, and connected to the outer frame and a pair of supports for floating the mirror plate and the outer frame from thereunder, wherein the plurality of connectors connecting the outer frame to the mirror plate comprises:

a first connector formed on a first line connecting the pair of elastic flexible structures, and symmetrically formed based to the mirror plate; and a second connector symmetrically formed relative to a second line perpendicular to the first line, and symmetrically formed based on the mirror plate.

* * * * *